(12) United States Patent
Abela

(10) Patent No.: US 7,994,645 B2
(45) Date of Patent: Aug. 9, 2011

(54) INTEGRATED CIRCUIT PACKAGE SYSTEM WITH WIRE-IN-FILM ISOLATION BARRIER

(75) Inventor: Jonathan Abela, Cudrefin (CH)

(73) Assignee: Stats Chippac Ltd., Singapore (SG)

( * ) Notice: Subject to any disclaimer, the term of this patent is extended or adjusted under 35 U.S.C. 154(b) by 469 days.

(21) Appl. No.: 12/169,342

(22) Filed: Jul. 8, 2008

(65) Prior Publication Data

US 2009/0014893 A1      Jan. 15, 2009

Related U.S. Application Data

(60) Provisional application No. 60/948,831, filed on Jul. 10, 2007.

(51) Int. Cl.
H01L 23/48 (2006.01)
H01L 23/52 (2006.01)
H01L 29/40 (2006.01)

(52) U.S. Cl. ......... 257/783; 257/782; 257/686; 438/127

(58) Field of Classification Search .................. 257/686, 257/777, 783, 723, 724, 782; 438/118, 127, 438/125

See application file for complete search history.

(56) References Cited

U.S. PATENT DOCUMENTS

| | | | |
|---|---|---|---|
| 5,877,478 A * | 3/1999 | Ando | 257/777 |
| 6,340,846 B1 * | 1/2002 | LoBianco et al. | 257/783 |
| 6,388,313 B1 * | 5/2002 | Lee et al. | 257/686 |
| 6,472,758 B1 | 10/2002 | Glenn et al. | |
| 6,569,709 B2 | 5/2003 | Derderian | |
| 6,657,290 B2 | 12/2003 | Fukui et al. | |
| 6,869,828 B2 | 3/2005 | Derderian | |
| 6,870,269 B2 | 3/2005 | Derderian | |
| 6,919,627 B2 | 7/2005 | Liu et al. | |
| 6,977,439 B2 | 12/2005 | Kang et al. | |
| 7,005,577 B2 | 2/2006 | Lee et al. | |
| 7,037,756 B1 | 5/2006 | Jiang et al. | |
| 7,244,675 B2 | 7/2007 | Honda et al. | |
| 7,629,695 B2 * | 12/2009 | Yoshimura et al. | 257/777 |
| 2002/0153615 A1 * | 10/2002 | Komiyama et al. | 257/777 |
| 2005/0205981 A1 * | 9/2005 | Yoshimura et al. | 257/686 |
| 2005/0224959 A1 | 10/2005 | Kwon et al. | |
| 2005/0258545 A1 | 11/2005 | Kwon | |
| 2007/0052089 A1 | 3/2007 | Kim et al. | |
| 2008/0017968 A1 * | 1/2008 | Choi et al. | 257/686 |
| 2010/0123236 A1 * | 5/2010 | Kang | 257/686 |

FOREIGN PATENT DOCUMENTS

JP       08-106818      4/1996

* cited by examiner

*Primary Examiner* — S. V Clark
(74) *Attorney, Agent, or Firm* — Mikio Ishimaru

(57) ABSTRACT

An integrated circuit package in package system includes: providing a substrate having a first wire-bonded die with an active side mounted above; connecting the active side of the first wire-bonded die to the substrate with a bond-wire; mounting a wire-in-film adhesive having an isolation barrier over the first wire-bonded die; and encapsulating the first wire-bonded die, the bond-wires, and the wire-in-film adhesive with an encapsulation.

8 Claims, 4 Drawing Sheets

INTEGRATED CIRCUIT PACKAGE SYSTEM WITH WIRE-IN-FILM ISOLATION BARRIER

CROSS-REFERENCE TO RELATED APPLICATION(S)

This application claims the benefit of U.S. Provisional Patent Application Ser. No. 60/948,831 filed on Jul. 10, 2007, and the subject matter thereof is hereby incorporated herein by reference thereto.

TECHNICAL FIELD

The present invention relates generally to integrated circuit package systems, and more particularly to integrated circuit systems with wire-in-film.

BACKGROUND ART

The rapidly growing portable electronics market, e.g. cellular phones, laptop computers, and PDAs, are an integral facet of modern life. The multitude of portable devices represents one of the largest potential market opportunities for next generation packaging. These devices have unique attributes which have significant impacts on manufacturing integration, in that they must be generally small, light weight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging and materials engineering and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high speed computer devices which are projected to exceed one TeraHertz (THz) in the near future. The current technologies, materials, equipment, and structures offer challenges to the basic assembly of these new devices while still not adequately addressing cooling and reliability concerns.

The envelope of technical capability of next generation IC package assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus a need still remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides an integrated circuit package in package system including: providing a substrate having external interconnects attached below and a first wire-bonded die with an active side mounted above; connecting the active side of the first wire-bonded die to the substrate with a bond-wire; mounting a wire-in-film adhesive having an isolation barrier over the first wire-bonded die; and encapsulating the first wire-bonded die, the bond-wires, and the wire-in-film adhesive with an encapsulation.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
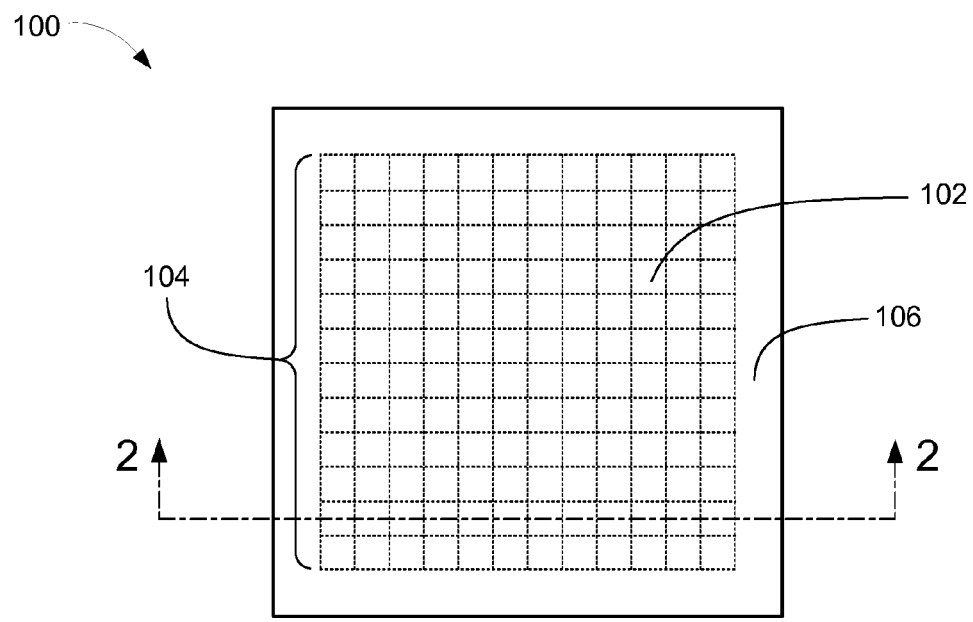
FIG. 1 is a top view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. Also, where multiple embodiments are disclosed and described having some features in common, for clarity and ease of illustration, description, and comprehension thereof, similar and like features one to another will ordinarily be described with like reference numerals.

Further, the embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the first wire-bonded die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "processing" as used herein includes deposition of material or photoresist, patterning, exposure, development, etching, cleaning, and/or removal of the material or photoresist as required in forming a described structure.

The term "system" as used herein refers to and is defined as the method and as the apparatus of the present invention in accordance with the context in which the term is used.

Referring now to FIG. 1, therein is shown a top view of an integrated circuit package system 100 in a first embodiment of the present invention. The integrated circuit package system 100 is shown having a structure such as a second wire-bonded die 102.

The structure may also be an interposer, or an internal stacking module comprised of an integrated circuit and an interposer. Below the second wire-bonded die 102 is a compound density isolation barrier such as an insulating grid 104. An encapsulation 106 is shown encapsulating the insulating grid 104 and the second wire-bonded die 102.

Figure 2:
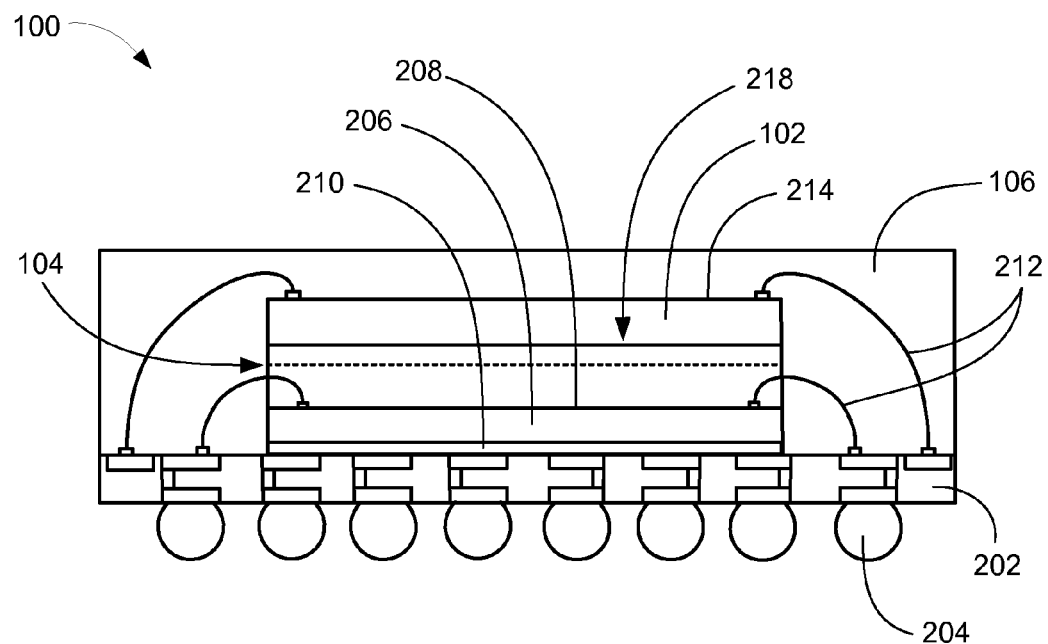
FIG. 2 is a cross sectional view of the integrated circuit package system along the line 2-2 of FIG. 1.

Referring now to FIG. 2, therein is shown a cross sectional view of the integrated circuit package system 100 along the line 2-2 of FIG. 1. The integrated circuit package system 100 is shown having a substrate 202 such as a plastic or ceramic substrate. The substrate 202 has external interconnects 204, such as solder balls attached beneath.

Above the substrate 202 is mounted a first wire-bonded die 206, with an active side 208. The first wire-bonded die 206 is attached to the substrate 202 with a die attach adhesive 210. The active side 208 of the first wire-bonded die 206 is connected to the substrate 202 with bond-wires 212.

Above the first wire-bonded die 206 is the second wire-bonded die 102 with an active side 214. The active side 214 of the second wire-bonded die 102 is connected to the substrate 202 with the bond-wires 212.

The second wire-bonded die 102 is attached to the first wire-bonded die 206 with a wire-in-film adhesive 218. The wire-in-film adhesive 218 has a low viscosity and, as temperature increases, the viscosity gets lower.

Therefore, the wire-in-film adhesive 218 can be easily pressed over the bond wires 212 and above and around the first wire-bonded die 206 and then cured to harden the wire-in-film adhesive 218.

It has been discovered that the wire-in-film adhesive 218 should be a thermally conductive dielectric material. The wire-in-film adhesive 218 can be made of a B-stage material that can be hardened after curing and can maintain a predetermined thickness.

The wire-in-film adhesive 218 has a single density and includes the insulating grid 104. The insulating grid 104 is a second density that is embedded in the wire-in-film adhesive 218 and prevents further penetration of the bond-wires 212 and contact with the second wire-bonded die 102.

As the demand for thinner chips intensifies engineers have reduced the size of the wire-in-film adhesive 218 to a point where the process suffers from minute variations in thickness of the wire-in-film adhesive 218 or the bond-wire 212 height.

This extreme sensitivity to minute variations resulted in shorted or broken bond-wires 212. The inventors discovered that the addition of the compound density isolation barrier 104 allows for more control of the process and decreases the sensitivity to small variations in height. This helps to increase line yield.

The compound density isolation barrier 104 may be a non conductive ceramic, plastic or composite material. The compound density isolation barrier 104 may be encapsulated by the wire-in-film adhesive 218.

The encapsulation 106 is shown encapsulating the first wire-bonded die 206, the bond-wires 212, and the wire-in-film adhesive 218.

Figure 3:
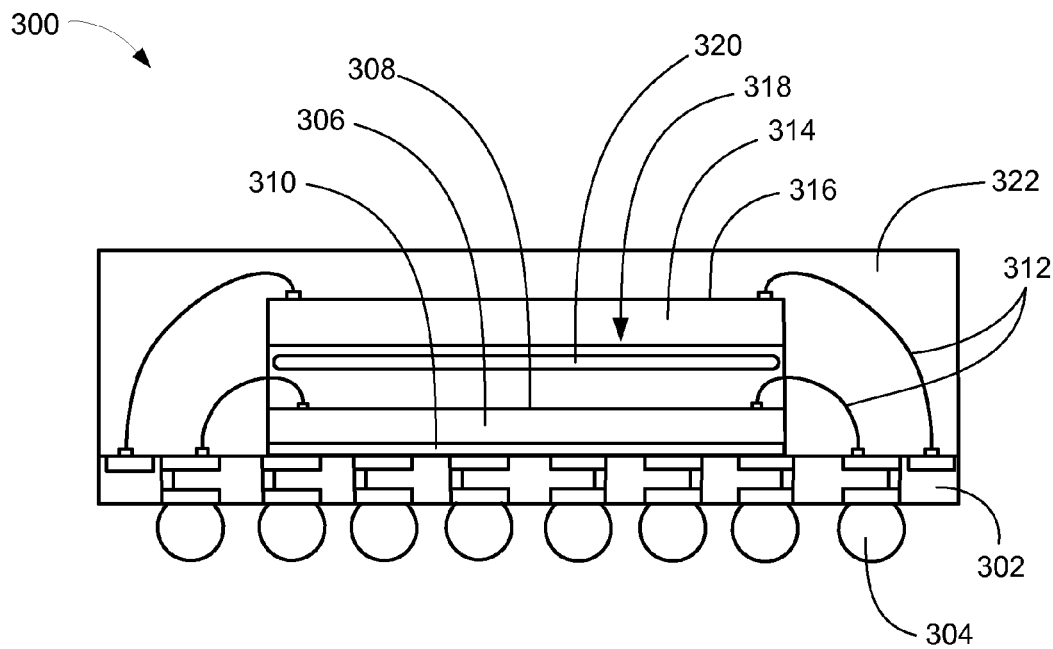
FIG. 3 is a cross sectional view of an integrated circuit package system in a second embodiment of the present invention.

Referring now to FIG. 3, therein is shown a cross sectional view of an integrated circuit package system 300 in a second embodiment of the present invention. The integrated circuit package system 300 is shown having a substrate 302 such as a plastic or ceramic substrate. The substrate 302 has external interconnects 304, such as solder balls attached beneath.

Above the substrate 302 is mounted a first wire-bonded die 306, with an active side 308. The first wire-bonded die 306 is attached to the substrate 302 with a die attach adhesive 310. The active side 308 of the first wire-bonded die 306 is connected to the substrate 302 with bond-wires 312.

Above the first wire-bonded die 306 is a structure such as a second wire-bonded die 314 with an active side 316. The active side 316 of the second wire-bonded die 314 is connected to the substrate 302 with the bond-wires 312.

The second wire-bonded die 314 is attached to the first wire-bonded die 306 with a wire-in-film adhesive 318. The wire-in-film adhesive 318 has a low viscosity and, as temperature increases, the viscosity gets lower.

Therefore, the wire-in-film adhesive 318 can be easily pressed over the bond wires 312 and above and around the first wire-bonded die 306 and then cured to harden the wire-in-film adhesive 318.

It has been discovered that the wire-in-film adhesive 318 should be a thermally conductive dielectric material. The wire-in-film adhesive 318 can be made of a B-stage material that can be hardened after curing and can maintain a predetermined thickness.

The wire-in-film adhesive 318 has a single density and includes a compound density isolation barrier such as an insulating spacer 320. The insulating spacer 320 may be embedded in the wire-in-film adhesive 318 at any point allowing sufficient room for the bond-wires 312 to be attached to the active side 308 of the first wire-bonded die 306. The insulating spacer 320 may be glass, ceramic, or other insulating materials. The insulating spacer 320 is a second density that is embedded in the wire-in-film adhesive 318 and prevents further penetration of the bond-wires 312 and contact with the second wire-bonded die 314.

As the demand for thinner chips intensifies engineers have reduced the size of the wire-in-film adhesive 318 to a point where the process suffers from minute variations in thickness of the wire-in-film adhesive 318 or the bond-wire 312 height.

This extreme sensitivity to minute variations resulted in shorted or broken bond-wires 312. The inventors discovered that the addition of the compound density isolation barrier 320 allows for more control of the process and decreases the sensitivity to small variations in height. This helps to increase line yield.

An encapsulation 322 is shown encapsulating the first wire-bonded die 306, the bond-wires 312, and the wire-in-film adhesive 318.

Figure 4:
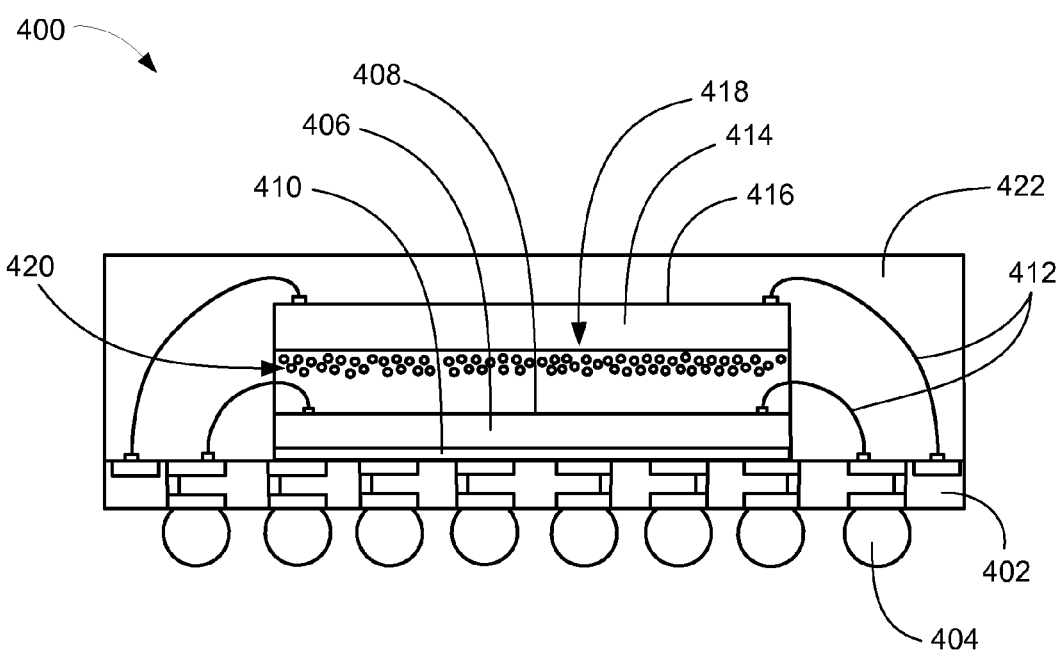
FIG. 4 is a cross sectional view of an integrated circuit package system in a third embodiment of the present invention.

Referring now to FIG. 4, therein is shown a cross sectional view of an integrated circuit package system 400 in a third embodiment of the present invention. The integrated circuit package system 400 is shown having a substrate 402 such as a plastic or ceramic substrate. The substrate 402 has external interconnects 404, such as solder balls attached beneath.

Above the substrate 402 is mounted a first wire-bonded die 406, with an active side 408. The first wire-bonded die 406 is attached to the substrate 402 with a die attach adhesive 410. The active side 408 of the first wire-bonded die 406 is connected to the substrate 402 with bond-wires 412.

Above the first wire-bonded die 406 is a structure such as a second wire-bonded die 414 with an active side 416. The active side 416 of the second wire-bonded die 414 is connected to the substrate 402 with the bond-wires 412.

The second wire-bonded die 414 is attached to the first wire-bonded die 406 with a wire-in-film adhesive 418. The wire-in-film adhesive 418 has a low viscosity and, as temperature increases, the viscosity gets lower.

Therefore, the wire-in-film adhesive 418 can be easily pressed over the bond wires 412 and above and around the first wire-bonded die 406 and then cured to harden the wire-in-film adhesive 418.

It has been discovered that the wire-in-film adhesive 418 should be a thermally conductive dielectric material. The wire-in-film adhesive 418 can be made of a B-stage material that can be hardened after curing and can maintain a predetermined thickness.

The wire-in-film adhesive 418 has a single density and includes a compound density isolation barrier such as insulating spheres 420. The insulating spheres 420 may be 5 μm to 10 μm in diameter. The insulating spheres 420 may be glass or other insulating materials. The insulating spheres 420 are a second density that are embedded in the wire-in-film adhesive 418 and prevent further penetration of the bond-wires 412 and contact with the second wire-bonded die 414.

As the demand for thinner chips intensifies engineers have reduced the size of the wire-in-film adhesive 418 to a point where the process suffers from minute variations in thickness of the wire-in-film adhesive 418 or the bond-wire 412 height.

This extreme sensitivity to minute variations resulted in shorted or broken bond-wires 412. The inventors discovered that the addition of the compound density isolation barrier 420 allows for more control of the process and decreases the sensitivity to small variations in height. This helps to increase line yield.

An encapsulation 422 is shown encapsulating the first wire-bonded die 406, the bond-wires 412, and the wire-in-film adhesive 418.

Figure 5:
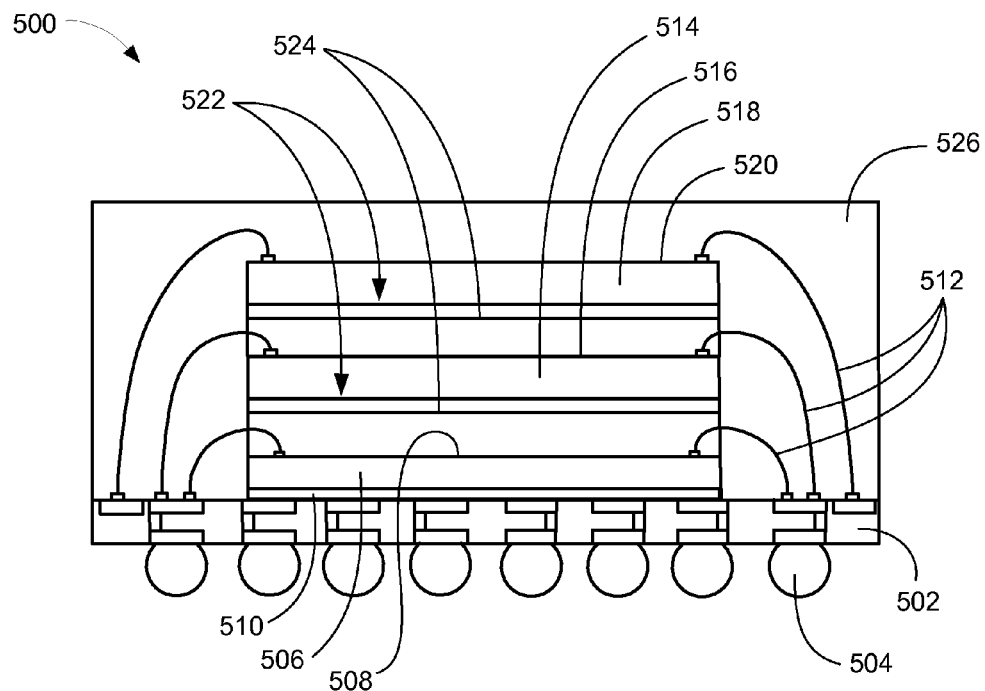
FIG. 5 is a cross sectional view of an integrated circuit package system in a fourth embodiment of the present invention.

Referring now to FIG. 5, therein is shown a cross sectional view of an integrated circuit package system 500 in a fourth embodiment of the present invention. The integrated circuit package system 500 is shown having a substrate 502 such as a plastic or ceramic substrate. The substrate 502 has external interconnects 504, such as solder balls attached beneath.

Above the substrate 502 is mounted a first wire-bonded die 506, with an active side 508. The first wire-bonded die 506 is attached to the substrate 502 with a die attach adhesive 510. The active side 508 of the first wire-bonded die 506 is connected to the substrate 502 with bond-wires 512.

Above the first wire-bonded die 506 is a second wire-bonded die 514 with an active side 516. The active side 516 of the second wire-bonded die 514 is connected to the substrate 502 with the bond-wires 512.

Above the second wire-bonded die 514 is a third wire-bonded die 518 with an active side 520. The active side 520 of the third wire-bonded die 518 is connected to the substrate 502 with the bond-wires 512.

The second wire-bonded die 514 is attached to the first wire-bonded die 506 and the third wire-bonded die 518 with multiple layers of multiple layers of wire-in-film adhesive 522. The multiple layers of wire-in-film adhesive 522 have a low viscosity and, as temperature increases, the viscosity gets lower.

Therefore, the multiple layers of wire-in-film adhesive 522 can be easily pressed over the bond wires 512 and above and around the first wire-bonded die 506 and the second wire-bonded die 514 and then cured to harden the multiple layers of wire-in-film adhesive 522.

It has been discovered that the multiple layers of wire-in-film adhesive 522 should be a thermally conductive dielectric material. The multiple layers of wire-in-film adhesive 522 can be made of a B-stage material that can be hardened after curing and can maintain a predetermined thickness.

The multiple layers of wire-in-film adhesive 522 have a single density and include a compound density isolation barrier such as an insulating sheet 524. The insulating sheet 524 may be a film adhesive of either the same B-stage material but pre cured or another density film that is pre laminated to the wire-in-film adhesive 522. The insulating sheet 524 is a second density that is embedded in the multiple layers of wire-in-film adhesive 522 and prevents further penetration of the bond-wires 512 and contact with the second wire-bonded die 514 and the third wire-bonded die 518.

As the demand for thinner chips intensifies engineers have reduced the size of the multiple layers of wire-in-film adhesive 522 to a point where the process suffers from minute variations in thickness of the multiple layers of wire-in-film adhesive 522 or the bond-wire 512 height.

This extreme sensitivity to minute variations resulted in shorted or broken bond-wires 512. The inventors discovered that the addition of the compound density isolation barrier 524 allows for more control of the process and decreases the sensitivity to small variations in height. This helps to increase line yield.

An encapsulation 526 is shown encapsulating the first wire-bonded die 506, the bond-wires 512, and the multiple layers of wire-in-film adhesive 522.

Figure 6:
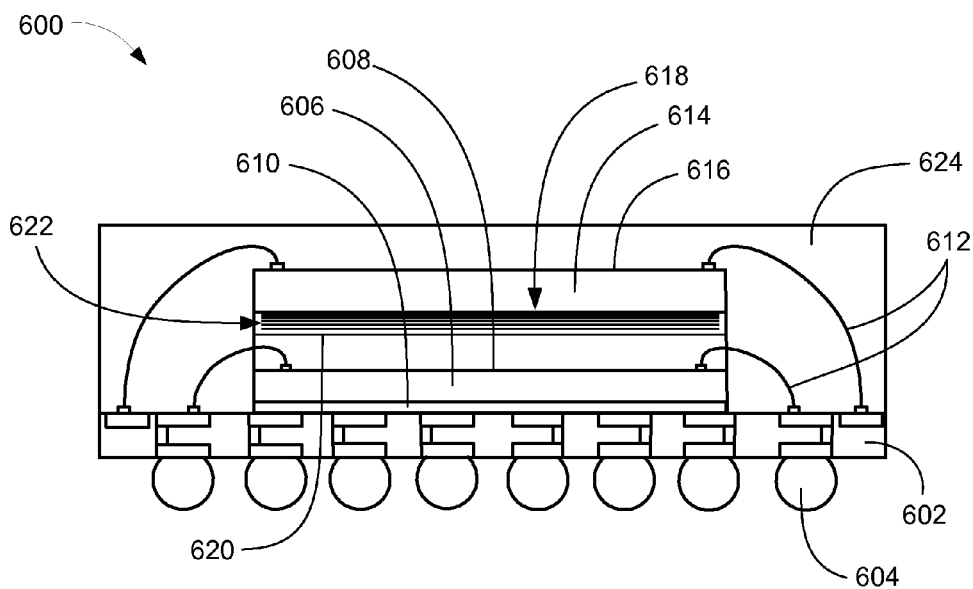
FIG. 6 is a cross sectional view of an integrated circuit package system in a fifth embodiment of the present invention.

Referring now to FIG. 6, therein is shown a cross sectional view of an integrated circuit package system 600 in a fifth embodiment of the present invention. The integrated circuit package system 600 is shown having a substrate 602 such as a plastic or ceramic substrate. The substrate 602 has external interconnects 604, such as solder balls attached beneath.

Above the substrate 602 is mounted a first wire-bonded die 606, with an active side 608. The first wire-bonded die 606 is attached to the substrate 602 with a die attach adhesive 610. The active side 608 of the first wire-bonded die 606 is connected to the substrate 602 with bond-wires 612.

Above the first wire-bonded die may be mounted a structure such as a second wire-bonded die 614, with an active side 616. The active side 616 of the second wire-bonded die 614 is connected to the substrate 602 with the bond-wires 612.

The second wire-bonded die 614 is attached to the first wire-bonded die 606 with a wire-in-film adhesive 618. The wire-in-film adhesive 618 has a gradient density that increases nearer the second wire-bonded die 614.

The viscosity and the density are low near the active side 608 of the first wire-bonded die 606 and increases near the second wire-bonded die 614. Therefore, the wire-in-film adhesive 618 can be easily pressed over the bond-wires 612 and above and around the first wire-bonded die 606. The wire-in-film adhesive 618 may have a substantially linear density progression 622, increasing linearly from the first wire-bonded die 606 to the second wire-bonded die 614.

The wire-in-film adhesive 618 creates an isolation barrier, such as a gradient density barrier 620, at a point where the density of the wire-in-film adhesive 618 does not allow further penetration of the bond-wires 612 thus preventing the bond-wires 612 from contacting the second wire-bonded die 614.

As the demand for thinner chips intensifies engineers have reduced the size of the wire-in-film adhesive 618 to a point where the process suffers from minute variations in thickness of the wire-in-film adhesive 618 or the bond-wire 612 height.

This extreme sensitivity to minute variations resulted in shorted or broken bond-wires 612 and the structure 614. The inventors discovered that the addition of the isolation barrier 620 allows for more control of the process and decreases the sensitivity to small variations in height. This helps to increase line yield.

The gradient density barrier 620 may be created by pre-curing the gradient density barrier 620 of the wire-in-film adhesive 618. Pre-curing can accurately produce the desired amount and type of density required for the substantially linear density progression 622.

The gradient density barrier 620 may also be created using a thickness reduction or an electro-potential attraction. The electro-potential attraction method may use decreasing potentials over increasing time periods to create the substantially linear density progression 622. An encapsulation 624 is shown encapsulating the first wire-bonded die 606, the bond-wires 612, and the wire-in-film adhesive 618.

Figure 7:
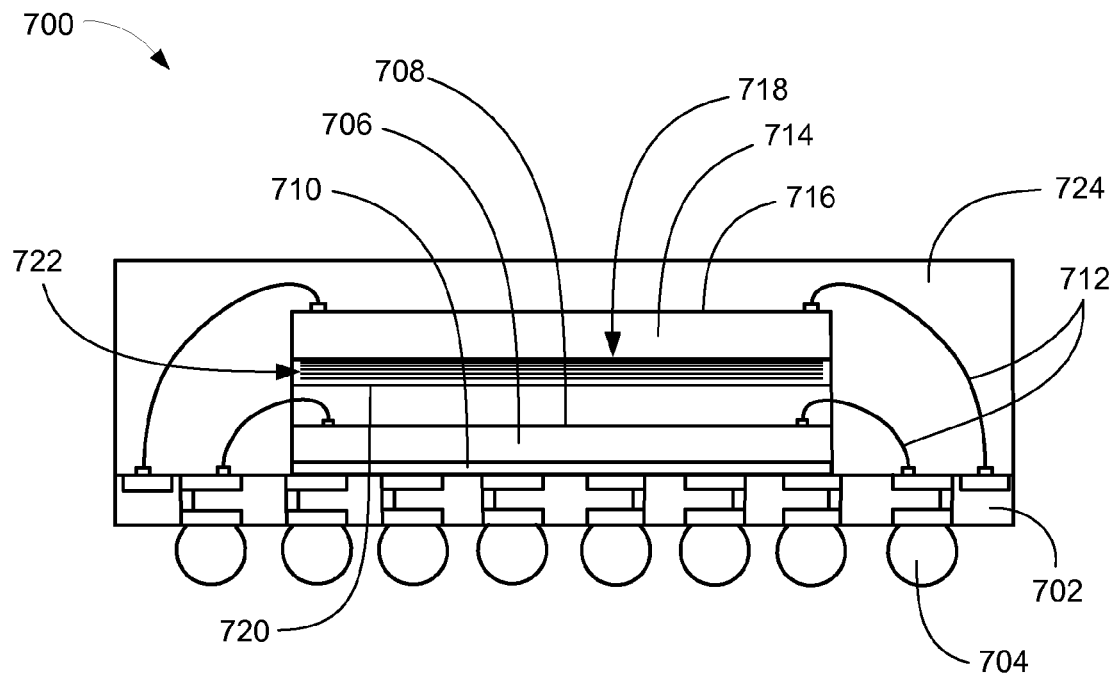
FIG. 7 is a cross sectional view of an integrated circuit package system in a sixth embodiment of the present invention.

Referring now to FIG. 7, therein is shown a cross sectional view of an integrated circuit package system 700 in a sixth embodiment of the present invention. The integrated circuit package system 700 is shown having a substrate 702 such as a plastic or ceramic substrate. The substrate 702 has external interconnects 704, such as solder balls attached beneath.

Above the substrate 702 is mounted a first wire-bonded die 706, with an active side 708. The first wire-bonded die 706 is attached to the substrate 702 with a die attach adhesive 710. The active side 708 of the first wire-bonded die 706 is connected to the substrate 702 with bond-wires 712.

Above the first wire-bonded die may be mounted a structure such as a second wire-bonded die 714, with an active side 716. The active side 716 of the second wire-bonded die 714 is connected to the substrate 702 with the bond-wires 712.

The second wire-bonded die 714 is attached to the first wire-bonded die 706 with a wire-in-film adhesive 718. The wire-in-film adhesive 718 has a gradient density that increases nearer the second wire-bonded die 714.

The viscosity and the density are low near the active side 708 of the first wire-bonded die 706 and increases near the second wire-bonded die 714. Therefore, the wire-in-film adhesive 718 can be easily pressed over the bond-wires 712 and above and around the first wire-bonded die 706. The wire-in-film adhesive 718 may also have a substantially exponential density progression 722, increasing exponentially from the first wire-bonded die 706 to the second wire-bonded die 714.

The wire-in-film adhesive 718 creates an isolation barrier, such as a gradient density barrier 720, at a point where the density of the wire-in-film adhesive 718 does not allow further penetration of the bond-wires 712 thus preventing the bond-wires 712 from contacting the second wire-bonded die 714.

As the demand for thinner chips intensifies engineers have reduced the size of the wire-in-film adhesive 718 to a point where the process suffers from minute variations in thickness of the wire-in-film adhesive 718 or the bond-wire 712 height.

This extreme sensitivity to minute variations resulted in shorted or broken bond-wires 712 and the structure 714. The inventors discovered that the addition of the isolation barrier 720 allows for more control of the process and decreases the sensitivity to small variations in height. This helps to increase line yield.

The gradient density barrier 720 may be created by pre-curing the gradient density barrier 720 of the wire-in-film adhesive 718. Pre-curing can accurately produce the desired amount and type of density required for the substantially exponential density progression 722.

The gradient density barrier 720 may also be created using a thickness reduction or an electro-potential attraction. The electro-potential attraction method may use decreasing potentials over increasing time periods to create the substantially exponential density progression 722. An encapsulation 724 is shown encapsulating the first wire-bonded die 706, the bond-wires 712, and the wire-in-film adhesive 718.

Figure 8:
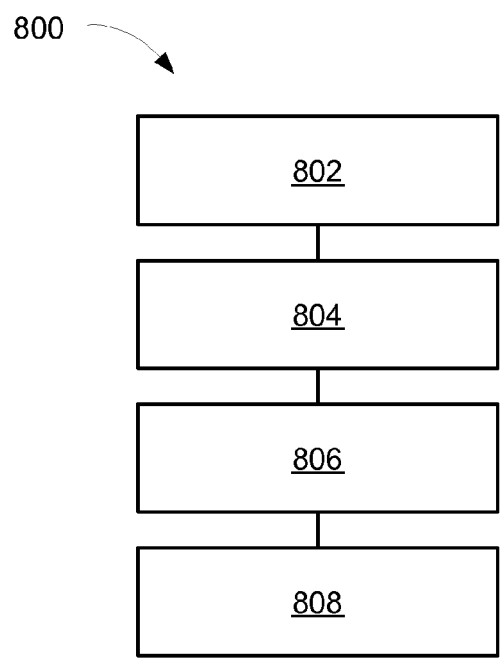
FIG. 8 is a flow chart of a system for manufacturing the integrated circuit package system of FIG. 1 in an embodiment of the present invention.

Referring now to FIG. 8, therein is shown a flow chart of a system 800 for manufacture of the integrated circuit package system 100. The system 800 includes providing a substrate having external interconnects attached below and a first wire-bonded die with an active side mounted above in a block 802; connecting the active side of the first wire-bonded die to the substrate with a bond-wire in a block 804; mounting a wire-in-film adhesive having an isolation barrier over the first wire-bonded die in a block 806; and encapsulating the first wire-bonded die, the bond-wires, and the wire-in-film adhesive with an encapsulation in a block 808.

Thus, it has been discovered that the isolation barrier of the present invention furnishes important and heretofore unknown and unavailable solutions, capabilities, and functional aspects for insulating bond-wires from contact with structures mounted above. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package in package system comprising:
   a substrate having a first wire-bonded die with an active side mounted above;
   a bond-wire connecting the active side of the first wire-bonded die to the substrate;
   a wire-in-film adhesive having a gradient density barrier over the first wire-bonded die; and
   an encapsulation encapsulating the first wire-bonded die, the bond-wires, and the wire-in-film adhesive.

2. The system as claimed in claim 1 wherein:
   the gradient density barrier includes a substantially linear density progression.

3. The system as claimed in claim 1 wherein:
   the gradient density barrier includes a substantially exponential density progression.

4. The system as claimed in claim 1 further comprising:
   a structure mounted over the wire-in-film adhesive.

5. A method of manufacture of an integrated circuit package in package system comprising:
   providing a substrate having a first wire-bonded die with an active side mounted above;
   connecting the active side of the first wire-bonded die to the substrate with a bond-wire;
   mounting a wire-in-film adhesive having a gradient density barrier over the first wire-bonded die; and
   encapsulating the first wire-bonded die, the bond-wires, and the wire-in-film adhesive with an encapsulation.

6. The method as claimed in claim 5 wherein:
   mounting the wire-in-film adhesive the gradient density barrier having a substantially linear density progression.

7. The method as claimed in claim 5 wherein:
   mounting the wire-in-film adhesive includes the gradient density barrier having a substantially exponential density progression.

8. A method of manufacture of an integrated circuit package in package system comprising:
   providing a substrate having a first wire-bonded die with an active side mounted above;
   connecting the active side of the first wire-bonded die to the substrate with a bond-wire;
   mounting a wire-in-film adhesive having an insulating grid over the first wire-bonded die;
   mounting a structure over the first wire-bonded die and the wire-in-film adhesive;
   connecting the structure with the bond-wires to the substrate; and
   encapsulating the first wire-bonded die, the bond-wires, and the wire-in-film adhesive with an encapsulation.

* * * * *

UNITED STATES PATENT AND TRADEMARK OFFICE
CERTIFICATE OF CORRECTION

| | | |
|---|---|---|
| PATENT NO. | : 7,994,645 B2 | Page 1 of 1 |
| APPLICATION NO. | : 12/169342 | |
| DATED | : August 9, 2011 | |
| INVENTOR(S) | : Abela | |

It is certified that error appears in the above-identified patent and that said Letters Patent is hereby corrected as shown below:

Column 10:
    line 6, delete "adhesive the" and insert therefor --adhesive includes the--

Signed and Sealed this
Eighth Day of May, 2012

David J. Kappos
*Director of the United States Patent and Trademark Office*